United States Patent [19]
Conti et al.

[11] Patent Number: 5,113,133
[45] Date of Patent: May 12, 1992

[54] CIRCUIT BOARD TEST PROBE

[75] Inventors: Joseph A. Conti, Whitestone; James Liantonio, Huntington, both of N.Y.

[73] Assignee: Integri-Test Corporation, Commack, N.Y.

[21] Appl. No.: 630,585

[22] Filed: Dec. 20, 1990

[51] Int. Cl.⁵ .................. G01R 31/02; G01R 1/06
[52] U.S. Cl. ................. 324/158 P; 324/72.5; 324/158 F
[58] Field of Search .......... 324/158 P, 158 F, 72.5; 439/482, 824

[56] References Cited

U.S. PATENT DOCUMENTS

| | | | |
|---|---|---|---|
| 3,940,786 | 2/1976 | Scheingold et al. | 357/74 |
| 4,035,722 | 7/1977 | Ryabov et al. | 324/158 P |
| 4,112,363 | 9/1978 | Morrison et al. | 324/72.5 |
| 4,336,496 | 6/1982 | Schnabl et al. | 324/158 P |
| 4,423,376 | 12/1983 | Byrnes et al. | 324/158 P |
| 4,544,889 | 10/1985 | Hendriks et al. | 324/158 P |
| 4,633,176 | 12/1986 | Reimer | 324/158 P |
| 4,647,852 | 3/1987 | Smith et al. | 324/158 P |
| 4,871,964 | 10/1989 | Boll et al. | 324/158 F |
| 4,959,609 | 9/1990 | Prokopp et al. | 324/158 P |

*Primary Examiner*—Kenneth A. Wieder
*Assistant Examiner*—Vinh P. Nguyen
*Attorney, Agent, or Firm*—Salzman & Levy

[57] ABSTRACT

A probe apparatus that permits high speed measurement of electrical parameters of a printed circuit board. The probe makes a soft landing upon the circuit board surface, and is laterally constrained to prevent damaging side movements. The probe is both accurate and non-injurious to the surface of a circuit board under test. A recoil mechanism and the damping action of a dashpot control the impact of the probe upon the printed circuit board.

28 Claims, 2 Drawing Sheets

CIRCUIT BOARD TEST PROBE

FIELD OF THE INVENTION

This invention relates to circuit tester probes, and more particularly to an improved probe for testing and measuring the electrical integrity of circuits through terminal points or contacts and circuit connections on printed circuit and interconnection boards.

BACKGROUND OF THE INVENTION

Machines are presently available for testing the integrity of printed circuit boards by making thousands of rapid measurements of the printed electrical elements and connections situated on these boards. The contacts and connections of these boards are sequentially tested by these machines according to an interrogation program. The program instructs and directs the rapid movement of an electrical probe about the circuit board. When the probe makes contact with a board element, resistance, impedance and capacitance readings are taken to determine the integrity of the printed circuit.

One of the major problems with taking these rapidly applied measurements relates to making proper electrical contact with the conductive surfaces. Very often, the electrical probe will make a "hard landing" on conductive elements that are only a few thousandths of an inch in thickness. If the probe is caused to cavitate or mar the test surface, the electrical reading may be changed, and in severe cases, the electrical connection may be damaged or opened. It is also not uncommon for the same point on the circuit to be probed more than once. Repeated probing, even where the probe is gently applied, can introduce distortions in the circuit connection.

As printed circuits become more dense, contact points become smaller, and as measurements are more rapidly obtained and positional accuracy becomes a more important factor, the proper application of a test probe becomes critical.

Another problem in obtaining these test readings is the unevenness of the contact surfaces. Under microscopic inspection, it is often observed that printed surfaces are often rounded or sloped, rather than being flat. A probe contacting uneven surfaces may be caused to bounce or slide over these surfaces upon contact. In such situations, the connections may become damaged, or the reading may be inaccurate.

Current high technology circuit boards and demanding test probe conditions have caused a need for a new probe design and driving mechanism.

The present invention provides a new driving system and test probe configuration for the accurate and delicate testing and measurement of printed circuit connections.

DISCUSSION OF THE RELATED ART

In U.S. Pat. No. 4,035,722, issued to Ryabov et al on July 12, 1977, for "Multiprobe Head for Checking Electrical Parameters of Semiconductor Instruments and Microcircuits," a probe head is illustrated wherein a biasing loop is provided for each probe element. Each biasing loop is disposed in a cavity of the probe head, and is designed to develop a contact force between its respective probe and a circuit contact element.

In U.S. Pat. No. 4,633,176, issued to Reimer on Dec. 30, 1986, for "Test Fixture Including Deflectable Probes," a plurality of probes is shown, arranged in a grid. Each probe in the grid is disposed upon a flexible shaft in order to allow it to contact a circuit test point that is not in alignment with the vertical axis of the test probe.

A multicontact test probe apparatus depicted in U.S. Pat. No. 4,112,363, issued to Morrison et al on Sept. 5, 1978, features a plurality of probes for engaging contact members of the circuit board with a constant force insufficient to damage their connection to the circuit device.

In U.S. Pat. No. 4,871,964, issued to Boll et al on Oct. 3, 1989, for "Integrated Circuit Probing Apparatus," a probe system is illustrated wherein some of the probe elements comprise a flexible leaf spring which allows the probe to bend and allows other probes in the system to contact their respective test pads.

A circuit board test apparatus shown in U.S. Pat. No. 3,940,786, issued to Scheingold et al on Feb. 24, 1976, depicts a contact element comprising an "S" shape that permits large deflective capability under reasonable stress and load conditions.

SUMMARY OF THE INVENTION

In accordance with the present invention, there is provided a probe apparatus that permits high speed measurement of electrical parameters of a printed circuit board. The probe makes a soft landing upon the circuit board surface, and is thus non-injurious to the surface of a circuit board under test. The probe apparatus provides a precise and repeatable positioning, and can therefore be applied to very small as well as delicate contact points of the circuit board. The probe apparatus features a leaf spring driven by rotating disc or drum that is rotatively attached to, and driven by a rotary solenoid. The leaf spring which is in and of itself the measuring probe, is wrapped about the periphery of the disc. The rotating disc forces the leaf spring through a narrow linear cavity, which constrains the movement of the flexible leaf spring within an axial, vertical direction. The axial, vertical movement precisely places the tip of the leaf spring upon the desired contact pad to be measured. One of the vertical walls of the cavity is biased to allow for different thicknesses of leaf spring to be accommodated in the cavity. The biasing also compensates for frictional wear and for differences in thickness tolerance. The biased wall of the cavity additionally prevents lateral movement of the probe during contact with the circuit board. In this manner, the biased wall prevents the head of the probe from sliding over curved or sloped surfaces on the contact pads.

A side cavity disposed adjacent to the linear cavity supports a curved recoil portion of the leaf spring. The curved recoil portion of the leaf spring probe acts to absorb tho contact reactive force exerted upon the head of the leaf spring probe at impact. When the probe makes contact with the surface of the circuit board, the curved extension of the spring is caused to buckle, thus absorbing the contact force and providing a soft landing for the probe head.

The disc rotatively connected to, and driven by, the rotary solenoid, is limited in its rotary travel by an adjustable shaft incorporating an internal dashpot. The shaft intercepts an abutment on the disc, thus limiting the travel of the disc, and hence the throw of the leaf spring probe. At the end of the adjustable shaft, an engaging pin serves as a link to the internal dashpot.

The pin also intercepts the abutment on the rotating disc, and via the dashpot, damps the impact speed of the probe. In this manner, the probe is designed for quick initial acceleration and impact deceleration.

The leaf spring is held in place upon the disc by a single set screw or detent, for ease of replacement of the leaf spring. In this manner, it is easy to change worn or damaged leaf springs, or to change the size of the leaf spring probe.

It is an object of the invention to provide an improved electrical test probe apparatus.

It is also an object of the invention to provide a test probe that will insure excellent positional accuracy and repeatability.

It is another object of this invention to provide a high speed test probe that will not damage the surface of the printed circuit board.

It is a further object of the invention to provide an electrical test probe that will make a soft landing upon the test surface of the printed circuit board.

These and other objects of this invention will be better understood and will become more apparent with reference to the subsequent detailed description considered in conjunction with the accompanying drawings.

BRIEF DESCRIPTION OF THE DRAWINGS

For purposes of brevity and clarity, like elements will have the same designation throughout the figures, in which.

DESCRIPTION OF THE PREFERRED EMBODIMENT

Generally speaking, the invention features an electrical probe for obtaining measurements on contact pads and connections of a printed circuit board and interconnection networks. The driving mechanism of the probe is designed for quick initial acceleration of the probe, while achieving a soft landing upon the circuit board surface. The soft landing results from a unique built-in recoil mechanism at point of impact, that absorbs the reactive force exerted upon the probe. A damping mechanism acts in concert with the recoil mechanism to slow the probe at the point of impact. The probe comprises a thin, flexible leaf spring to reduce momentum during impact with the circuit board surface. The leaf spring probe is laterally constrained to increase accuracy and repeatability in its contact with the board, and to prevent movement across the surface of the board. All of the aforementioned features provide a probe that rapidly obtains electrical parameter measurements without damaging the circuit elements.

Figure 1:
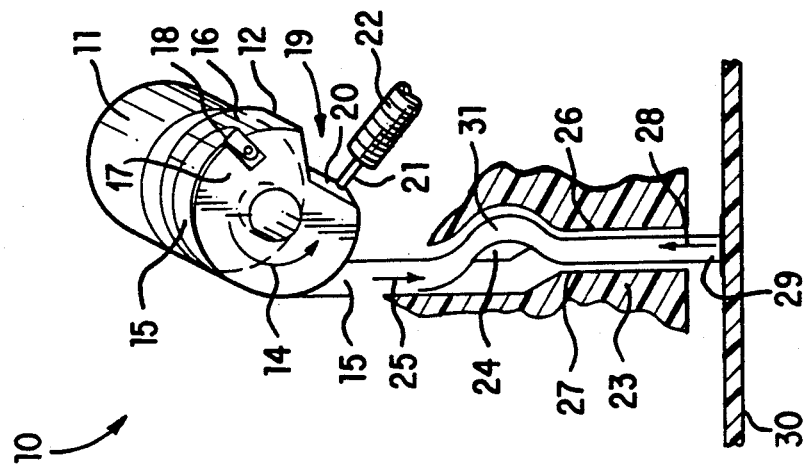
FIG. 1 is a perspective schematic view of the probe driving apparatus of this invention.

Now referring to FIG. 1, a schematic, perspective view of the mechanism of the probe apparatus 10 of this invention is shown. A rotary solenoid 11 is shown rotatively attached to a disc or drum 12. The rotary solenoid 11 rotatively drives the disc 12, as illustrated by arrow 14. A thin, flexible leaf spring probe 15 is wrapped about the peripheral surface 16 of the disc 12. The leaf spring probe 15 is bent over the edge of the disc 12, and is fixedly secured on the face 17 of the disc 12 by a single screw 18, as shown. The disc 12 has a cutaway portion 19. surface 20, that is utilized to limit the rotational travel of disc 12.

A pin 21 attached to an internal piston (not shown) of a dashpot 22, comes into contact with the abutment surface 20, near the end of the travel of disc 12. The end surface of dashpot 22 limits the travel of the disc 12 by acting as a stop. The dashpot 22 damps the deceleration of disc 12 via pin 21.

When the disc 12 is caused to rotate (arrow 14) under the driving influence of the rotary solenoid 11, the leaf spring probe 15 is caused to move in concert with the disc 12. The rotary motion of the disc 12 is translated into a downward, vertical movement (arrow 25) for the leaf spring probe 15. The probe 15 is narrowly directed into, and guided by, a constraining cavity 23, defined by walls 26 and 27, respectively. The constraining cavity 23 directs and guides the downwardly moving (arrow 25) leaf spring probe 15 into contacting the circuit board surface 30. When the head 29 of the probe 15 hits the surface 30 of the circuit board, a reactive, recoil force (arrow 28) is exerted upon the probe 15. The probe 15, being comprised of a thin, flexible leaf spring, will be caused to buckle and form a loop 31 in a recoil cavity 24 disposed immediately preceding and adjacent the constraining cavity 23. This recoil cavity 24 has as its purpose to absorb the impact forces upon the downwardly moving probe 15, and thus provides a soft landing for the probe during contact with surface 30.

The soft landing of the probe 15 is provided by the recoil loop 31 and the damping of the impact deceleration by dashpot 22. This combination of cushioning effects allows for the initial rapid acceleration of the probe without causing damage to the test surface. It is important to have initial rapid acceleration, so that the testing machine can operate at greater speed.

Figure 3:
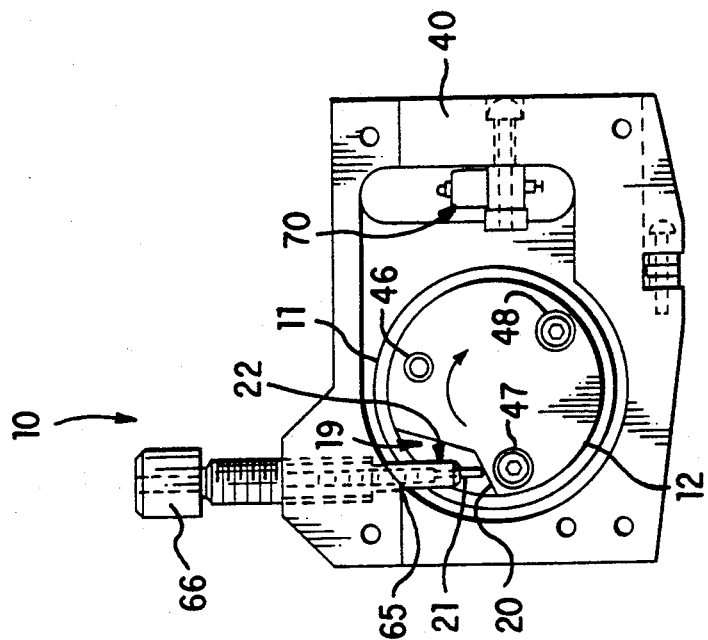
FIG. 3 is a back view of the probe driving apparatus shown in FIG. 2.
Figure 2:
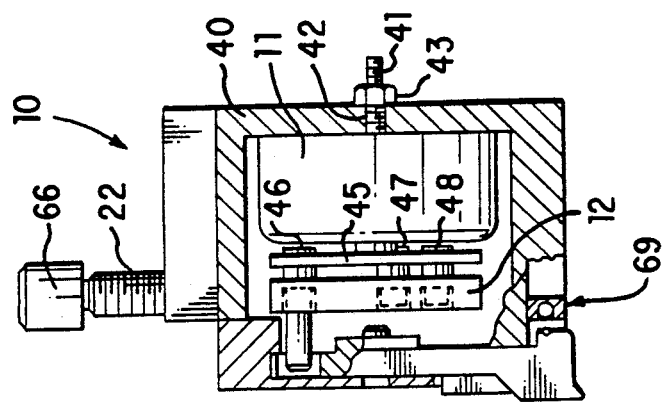
FIG. 2 is a sectional side view of the probe driving apparatus of this invention, illustrated in greater detail.
Figure 4:
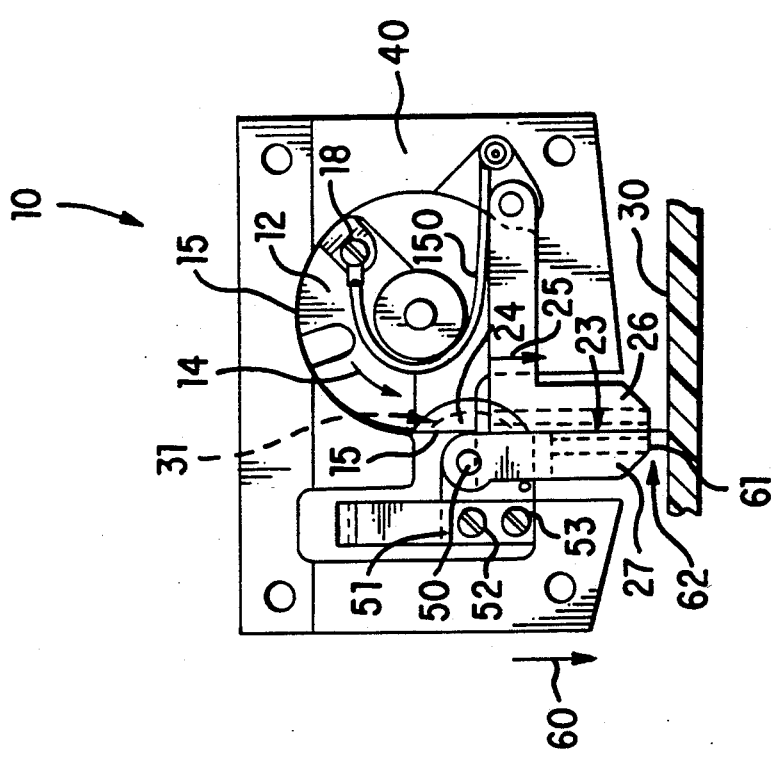
FIG. 4 is a sectional front view of the driving disc depicted in FIGS 2 and 3.

Now referring to FIGS. 2 through 4, the probe apparatus 10 of this invention is shown in more detail. FIG. 2 is a sectional view illustrating the driving mechanism in more detail. The rotary solenoid 11 is secured to the housing 40 by means of a mounting bolt 41 that passes through hole 42 where it is secured by nut 43.

The rotary solenoid 11 has a mounting plate 45 to which the disc 12 is rotatively secured by three mounting screws 46, 47 and 48, respectively, that pass through the disc 12 and seat in mounting plate 45 (shown in better detail in FIG. 3).

The leaf spring probe 15 is secured to disc 12 as aforementioned by a single screw 18 that also secures the electrical lead 150, as shown in FIG. 4. The leaf spring probe 15 is wrapped about the disc 12, and is driven forward (arrow 14) when the disc 12 is rotatively moved by the solenoid 11. It will be observed that the leaf spring probe 15 is driven vertically downward (arrow 25) through constraining cavity 23. The leaf spring probe 15 is relatively rigid and straight in its downward travel, as shown. Upon impacting surface 30, the probe 15 experiences a reaction force, which causes the leaf spring probe 15 to bend or buckle into loop 31 (shown in phantom) within the recoil cavity 24.

The constraining cavity 23 comprises two plastic wall pieces 26 and 27, respectively. Wall piece 27 is rotatively biased towards wall piece 26, about pivot pin 50. The wall piece 27 is biased about pivot pin 50 by a small coil spring (not shown) that is wrapped about pivot pin 50 and is secured to housing 40. The biasing of the wall piece 27 toward its adjacent wall piece 26 allows for proper confinement of the leaf spring probe 15 within constraining cavity 23, and allows the apparatus to accommodate leaf spring probes of varying thicknesses. The biasing also adjusts for manufacturing tolerance abnormalities in the thickness of the leaf spring probe 15, as well as for changes in the thickness due to frictional wear.

In calibrating the measuring instrument, the housing 40 is moved downwardly (arrow 60, FIG. 4) until the nose 61 of the wall pieces 26 and 27, respectively, touches the test surface 30. As the housing 40 moves downwardly, a microswitch 70, shown in FIG. 3, is caused to close. The microswitch 70 closes after a given amount of travel in the downward direction (arrow 60), thus setting the gap distance 62 between the nose 61 of wall pieces 26 and 27, and the test surface 30.

Referring to FIG. 3, a better view of the cutaway portion 19 of disc 12 is observed. The cutaway portion 19, with its abutment surface 20, is shown contacting the limit pin 21, as the disc 12 is rotatively moved (arrow 14). The pin 21 is an extension of piston 65 of the dashpot 22. An adjustment knob 66 changes the forward extension of the end surface of dashpot 22. The end surface extension adjusts the rotational travel of disc 12. The dashpot 22, via pin 21, acts to damp the deceleration of the disc 12 and the attached probe 15 as the leaf spring probe 15 comes into contact with the test surface 30.

Referring to FIG. 2, an optical sensor 69 is shown. The optical sensor monitors the withdrawal of the leaf spring probe 15 from contact with the test surface 30, wherein the testing machine moves the housing 40 to a new test position about the circuit board for the measurement of different contact pads or connections.

Figure 5:
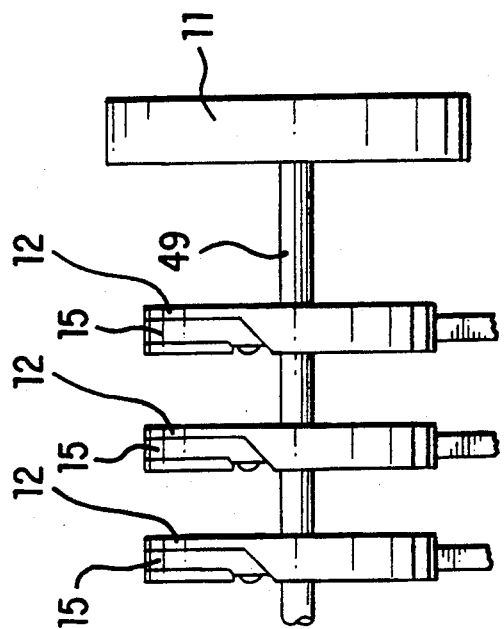
FIG. 5 is an alternate embodiment of the probe driving apparatus of FIG. 1, wherein several probes can be driven from the same solenoid to create a multiple probe testing apparatus.

Referring to FIG. 5, a schematic diagram illustrates an alternate embodiment of the driving mechanism of the invention. The solenoid 11 can be rotatively attached to a number of discs 12 via shaft 49, as illustrated. Each disc 12 will drive a respective leaf spring probe 15. Such a configuration can be utilized to provide a multiple probe approach to the testing of a circuit board, while obtaining the benefits and advantages of the invention.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented by the subsequently appended claims.

What is claimed is:

1. A circuit test probe apparatus for testing and measuring electrical integrity of circuit boards, comprising:
   driving means for providing rotary driving motion;
   translating means connected to said driving means for translating said rotary motion into linear motion;
   means defining a test probe translational movement axis;
   a test probe operatively connected to said translating means and being driven in a linear direction along said test probe translational movement axis toward impact with a circuit board to be tested; and
   recoil means operatively connected with said translating means and disposed along said test probe translational movement axis for absorbing the impact of said test probe with said circuit board, whereby said test probe will attain a soft landing upon said circuit board.

2. The circuit test probe apparatus for testing and measuring electrical integrity of circuit boards in accordance with claim 1, wherein said driving means comprises a rotary solenoid.

3. The circuit test probe apparatus for testing and measuring test integrity of circuit boards in accordance with claim 1, wherein said electrical probe comprises a flexible leaf spring.

4. The circuit test probe apparatus for testing and measuring electrical integrity of circuit boards in accordance with claim 1, wherein said translating means comprises a rotary disc for supporting and driving said test probe, and means defining a constraining cavity for guiding said driven test probe along said test probe translational movement axis.

5. The circuit test probe apparatus for testing and measuring electrical integrity of circuit boards in accordance with claim 4, wherein said translating means has means defining an abutment surface for limiting travel of said test probe along said test probe translational movement axis.

6. The circuit test probe apparatus for testing and measuring electrical integrity of circuit boards in accordance with claim 1, further comprising damping means operatively connected to said translating means for damping the impact of said test probe.

7. The circuit test probe apparatus for testing and measuring electrical integrity of circuit boards in accordance with claim 6, wherein said damping means comprises a dashpot.

8. The circuit test probe apparatus for testing and measuring electrical integrity of circuit boards in accordance with claim 1, wherein said translating means has means defining an abutment surface for limiting travel of said test probe along said test probe translational movement axis.

9. The circuit test probe apparatus for testing and measuring electrical integrity of circuit boards in accordance with claim 1, wherein said test probe comprises a flexible leaf spring, and said recoil means comprises means defining a recoil cavity wherein said leaf spring forms a loop that absorbs the impact of the test probe with said circuit board.

10. A circuit testing probe apparatus for testing and measuring electrical integrity of a circuit, comprising:
    driving means for providing rotary driving motion;
    translating means connected to said driving means for translating said rotary driving motion into linear driving motion;
    means defining a test probe linear driving axis;
    a test probe operatively connected to said translating means and being driven in a linear direction along said test probe linear driving axis toward impact with a circuit board to be tested; and
    biasing means defining a movable wall disposed along said test probe linear driving axis for constraining lateral movement of said test probe, whereby said test probe will be prevented from moving laterally across said circuit board at impact therewith.

11. The circuit testing probe apparatus for testing and measuring electrical integrity of circuit boards in accordance with claim 10, wherein said driving means comprises a rotary solenoid.

12. The circuit testing probe apparatus for testing and measuring electrical integrity of circuit boards in accordance with claim 10, wherein said test probe comprises a flexible leaf spring.

13. The circuit testing probe apparatus for testing and measuring electrical integrity of circuit boards in accordance with claim 10, wherein said translating means comprises a rotary disc for supporting and driving said test probe, and further comprising means defining a constraining cavity for guiding said driven test probe along said test probe linear driving axis.

14. The circuit testing probe apparatus for testing and measuring electrical integrity of circuit boards in accordance with claim 13, wherein said translating means has means defining an abutment surface for limiting travel of said test probe along said test probe linear driving axis.

15. The circuit testing probe apparatus for testing and measuring electrical integrity of circuit boards in accordance with claim 10, further comprising damping means operatively connected to said translating means for damping the impact of said test probe.

16. The circuit testing probe apparatus for testing and measuring electrical integrity of circuit boards in accordance with claim 15, wherein said damping means comprises a dashpot.

17. The circuit testing probe apparatus for testing and measuring electrical integrity of circuit boards in accordance with claim 10, wherein said translating means has means defining an abutment surface for limiting travel of said test probe along said test probe linear driving axis.

18. The circuit testing probe apparatus for testing and measuring electrical integrity of circuit boards in accordance with claim 10, wherein said test probe comprises a flexible leaf spring, and further comprising recoil means defining a recoil cavity wherein said leaf spring forms a loop that absorbs the impact of the test probe with said circuit board.

19. A circuit testing probe apparatus for testing and measuring electrical integrity of a circuit, comprising:
    driving means for providing rotary driving motion;
    translating means connected to said driving means for translating said rotary motion into linear motion;
    means defining a test probe travel axis;
    a test probe operatively connected to said translating means and being driven in a linear direction along said test probe travel axis toward impact with a circuit board to be tested; and
    damping means operatively connected to said translating means for damping deceleration of said test probe at impact with said circuit board.

20. The circuit testing probe apparatus for testing and measuring electrical integrity of circuit boards in accordance with claim 19, wherein said test probe comprises a flexible leaf spring, and further comprising recoil means defining a recoil cavity wherein said leaf spring forms a loop that absorbs the impact of the test probe with said circuit board.

21. The circuit testing probe apparatus for testing and measuring electrical integrity of circuit boards in accordance with claim 19, wherein said driving means comprises a rotary solenoid.

22. The circuit testing probe apparatus for testing and measuring electrical integrity of circuit boards in accordance with claim 19, wherein said test probe comprises a flexible leaf spring.

23. The circuit testing probe apparatus for testing and measuring electrical integrity of circuit boards in accordance with claim 19, wherein said translating means comprises a rotary disc for supporting and driving said test probe, and further comprising means defining a constraining cavity for guiding said driven test probe along said test probe travel axis.

24. The circuit testing probe apparatus for testing and measuring electrical integrity of circuit boards in accordance with claim 19, wherein said translating means has means defining an abutment surface for limiting travel of said test probe along said test probe travel axis.

25. A circuit test probe apparatus for testing and measuring electrical integrity of a circuit, comprising:
    driving means for providing driving motion to a probe along a linear, probe travel axis;
    means defining a linear, probe travel axis;
    a flexible probe operatively connected to said driving means and being driven in a linear direction along said linear, probe travel axis toward impact with a circuit board to be tested; and
    constraining means operatively surrounding said flexible probe for constraining lateral movement of said flexible probe about said linear, probe travel axis, and to provide reliable contact with said circuit board at point of impact therewith, whereby said flexible probe cannot move laterally across a contact surface of said circuit board at point of impact.

26. The circuit testing probe apparatus for testing and measuring electrical integrity of circuit boards in accordance with claim 25, wherein said probe comprises a flexible leaf spring, and further comprising recoil means defining a recoil cavity wherein said leaf spring forms a loop that absorbs the impact of the probe with said circuit board.

27. The circuit testing probe apparatus for testing and measuring electrical integrity of circuit boards in accordance with claim 25, wherein said driving means comprises a rotary solenoid.

28. The circuit testing probe apparatus for testing and measuring electrical integrity of circuit boards in accordance with claim 27, further comprising translating means operatively adjacent said rotary solenoid for translating rotary motion into axial motion, whereby said flexible probe will be axially driven into contact with said circuit board.

* * * * *